United States Patent [19]
Tajima

[11] Patent Number: 6,052,516
[45] Date of Patent: Apr. 18, 2000

[54] AUTOMATIC LAYOUT APPARATUS AND METHOD USED IN ANALOG LSI LAYOUT DESIGN

[75] Inventor: Hisayuki Tajima, Kanagawa, Japan

[73] Assignee: NEC Corporation, Tokyo, Japan

[21] Appl. No.: 08/953,242

[22] Filed: Oct. 17, 1997

[30] Foreign Application Priority Data

Oct. 24, 1996 [JP] Japan ................................ 8-282312

[51] Int. Cl.7 .................................................. G06F 17/50
[52] U.S. Cl. .............................. 395/500.08; 395/500.09
[58] Field of Search ........................... 364/488, 489, 364/490, 491, 468.28; 365/51; 395/500, 500.01–500.19

[56] References Cited

U.S. PATENT DOCUMENTS

| | | | |
|---|---|---|---|
| 5,448,493 | 9/1995 | Weir et al. .......................... | 395/500.08 |
| 5,764,525 | 6/1998 | Mahmood et al. ................. | 395/500.19 |
| 5,787,268 | 7/1998 | Sugiyama et al. ....................... | 395/500 |
| 5,790,414 | 8/1998 | Okano et al. ............................ | 364/488 |
| 5,859,776 | 1/1999 | Sato et al. .......................... | 364/468.28 |
| 5,867,399 | 2/1999 | Rostoker et al. ........................ | 364/489 |
| 5,905,669 | 5/1999 | Horita ........................................ | 365/51 |

OTHER PUBLICATIONS

Berman and Trevillyan "Global Flow Optimization in automatic Logic Design," IEEE Transactions on Computer–Aided Design, vol. 10, No. 5, p. 557–564, May 1991.

Onoye et al. "An Automatic Layout Generator for Bipolar Analog Modules," Proceedings of the 1992 IEEE International Symposium on Circuits and Systems, p. 2264–2267, vol. 5, May 1992.

Yukimatsu et al. "A Fuzzy Expert System for Hierarchical Placement of Parts on Printed Circuit Board," IEEE p. 342–345, 1995.

*Primary Examiner*—Kevin J. Teska
*Assistant Examiner*—Leigh Marie Garbowski
*Attorney, Agent, or Firm*—Young & Thompson

[57] ABSTRACT

An automatic layout apparatus for laying out elements includes a connection information storage area, an extracted-element storage area, a layout condition file, an element layout section, a layout candidate element extraction section, a layout candidate element selection section, and a selected-element determination section. An element is laid out by the element layout section. A layout candidate element is extracted by the layout candidate element extraction section on the basis of the result of the element layout section and information of the connection information storage area. Information about the extracted layout candidate element is stored in the extracted-element storage area. The layout candidate element is selected by the layout candidate element selection section on the basis of the result of the layout candidate element extraction section or the information stored in the extracted-element storage area and information stored in the layout condition file. The selection result is determined by the selected-element determination section. When a layout candidate element must be selected again on the basis of a determination result, a layout candidate element is selected by the layout candidate selection section. A layout method for the apparatus is also disclosed.

8 Claims, 8 Drawing Sheets

FIG. 8

| PRIORITY | CONNECTION CONDITION |
|---|---|
| 1 | TRANSISTORS WITH SAME SIZE |
| 2 | RESISTORS OF SAME TYPE WITH SAME SIZE |
| 3 | HIGH RESISTANCE $\geq 50\,k\Omega$ |

AUTOMATIC LAYOUT APPARATUS AND METHOD USED IN ANALOG LSI LAYOUT DESIGN

BACKGROUND OF THE INVENTION

1. FIELD OF THE INVENTION

The present invention relates to an automatic layout apparatus and method of automatically selecting and laying out layout candidate elements in an analog LSI.

2. DESCRIPTION OF THE PRIOR ART

In an analog LSI layout design, a differential pair or current-mirror-connected bipolar transistors are laid out close to each other in consideration of the layout direction so as to satisfy the relative precision of element characteristics in order to satisfy the electrical characteristics of a circuit.

The feature in this case is common connection of emitters or bases. When a measure against crosstalk must be taken depending on a circuit arrangement, a layout in which lines need not be crossed is performed in a line design upon a layout design. When a measure against a heat source is necessary, a power transistor serving as the heat source and a signal system transistor having electrical characteristics changed by the heat must be laid out apart from each other.

Since the analog LSI layout design has many limitations including these items on the electrical characteristics of the circuit, it has manually been performed. However, as the analog LSI becomes larger in scale year by year, the design becomes more difficult to perform by the method of manually selecting layout candidate elements one by one such that the development period becomes longer. For this reason, the design period is tried to be shortened by, e.g., using the layout candidate element automatic selection function of an automatic layout/wiring apparatus used for a MOS or the like. Although layout candidate elements can be automatically selected by using the automatic layout/wiring apparatus, automatic selection is independent of the electrical characteristics and the intention of the layout designer because the automatic selection method is selection based on the element number order and selection based on the description order in a circuit information file. Accordingly, the layout designer must manually select elements again, so the design efficiency cannot be improved.

An example of a conventional layout flow in the use of the automatic layout/wiring apparatus will be described with reference to a flow chart shown in FIG. 1 and a circuit example shown in FIG. 6.

In the first step, connection information of a circuit shown in FIG. 6 is input (F-1). In the second step, an arbitrary element is manually selected and laid out (F-2). In this case, a transistor Q1 is selected and laid out. In the third step, a transistor Q2 is selected as a next layout candidate element in a tool of selecting elements in the element number order (F-3). Finally, in the fourth step, whether the transistor Q2 selected in the third step is proper is checked (F-4).

Since a transistor Q6 constituting a differential pair with the transistor Q1 is wanted to be laid out in an original analog LSI layout, the layout designer selects either of ① selection is canceled, and the flow returns to the second step to manually select the transistor Q6; and ② the transistor Q2 is tentatively laid out in the fifth step (F-5), and the flow returns to the third step to automatically, newly select a next layout candidate element. When tentative layout is performed, manual selection and re-layout must be performed at a proper time. In this manner, the processing from the second step to the fifth step is repeatedly executed until all elements are laid out.

As described above, the conventional operation is very cumbersome such that an automatically selected element is canceled to manually repeat selection/layout, or re-layout is performed at a proper time upon temporary tentative layout. Various automatic layout methods using an automatic layout/wiring apparatus are examined. In these methods, constraint items are registered in a database by, e.g., designating a relative layout definition or the like serving as a constraint item based on electrical characteristics unique to an analog circuit for a group in units of blocks, and automatic layout is performed on the basis of the database. This database has no versatility, and must be prepared for each product, resulting in a low efficiency.

The first problem of the prior art is therefore a low design efficiency. In the conventional manual layout method, layout candidate elements must be selected one by one, or when the layout candidate element automatic selection function of the automatic layout/wiring apparatus is used, layout candidate elements are automatically selected from elements which are not laid out yet. However, an element intended by the layout designer in consideration of a layout that satisfies the electrical characteristics such as the relative or absolute precision is not always selected as a layout candidate because the selection method is executed in the element number order or the description order in a connection information file. For this reason, an element must be manually selected again, or an optimal layout must be performed by temporarily performing tentative layout and selecting an element again at proper time.

The second problem of the prior art is that a database (limitation item) used in performing automatic layout by the conventional automatic layout/wiring apparatus has no versatility, and must be prepared for each product because the database is formed mainly using the element numbers or the element numbers of groups. That is, since the element numbers of respective products are different from each other, the database must be prepared for each product. Even in the same product, the database must be constructed again upon changing the circuit.

SUMMARY OF THE INVENTION

The present invention has been made to solve the above problems in the prior art, and has as its object to provide an automatic layout apparatus and method which are used in an analog LSI layout design and in which the layout of elements having desired electrical characteristics is facilitated, the layout design period can be shortened, a uniform high design efficiency is easily attained, and an optimal layout candidate element can be automatically selected.

To achieve the above object, according to the first aspect of the present invention, there is provided an automatic layout apparatus which lays out elements in an analog LSI layout design, comprising connection information storage means for storing connection information, extracted-element storage means for storing an extracted element, layout condition storage means for storing layout conditions, element layout means for laying out an element, layout candidate element means for extracting a layout candidate element, layout candidate element selection means for selecting the layout candidate element, and selected-element determination means for determining the selected layout candidate element, wherein an element is laid out by the element layout means on the basis of information of the connection information storage means and a result of the selected-element determination means, a layout candidate element is extracted by the layout candidate element extraction means on the basis of a result of the element layout means and information of the connection information storage means, information about the extracted layout candidate element is stored in the extracted-element storage means, the layout candidate element is selected by the layout candidate element selection means on the basis of a result of the layout candidate element extraction means or the information stored in the extracted-element storage means and information stored in the layout condition storage means, a selection result is determined by the selected-element determination means, and when a layout candidate element must be selected again on the basis of a determination result, a layout candidate element is selected by the layout candidate selection means.

According to the second aspect of the present invention, in the automatic layout apparatus defined in the first aspect, the information stored in the layout condition storage means can be layout condition information in which a circuit feature in a layout design is represented at an element level.

According to the third aspect of the present invention, in the automatic layout apparatus defined in the first aspect, the layout candidate element extraction means can use the element laid out by the element layout means as a reference, and can search for the connection information stored in the connection information storage means to extract all elements which are connected to the laid element and are not laid out yet.

To achieve the above object, according to the fourth aspect of the present invention, there is provided a layout method for an automatic layout apparatus, comprising the connection information storage step of receiving connection information and storing the information in connection information storage means, the selection/layout step of selecting/laying out an arbitrary transistor on the basis of the input connection information or information stored in the connection information storage means, the element extraction step of extracting an element to be connected, the first conditioning step of performing extraction of the connection information, condition determination of a connection strength, and layout candidate ordering on the basis of information about the element extracted and information stored in layout condition storage means, and storing results in first extracted-element storage means, the first automatic selection step of automatically selecting a layout candidate on the basis of information in the first conditioning step or the information stored in the first extracted-element storage means, the first determination step of determining whether automatic selection has been performed in the first automatic selection step, the first selection step of selecting whether automatic selection or arbitrary selection is performed when a determination result in the first determination step indicates that automatic selection has not been performed, the step of returning a flow to the first automatic selection step of automatically selecting the layout candidate when a selection result in the first selection step indicates automatic selection, the step of returning the flow to the selection/layout step when the selection result in the first selection step indicates arbitrary selection, the first layout step of executing layout when automatic selection is determined in the first determination step to have been performed, the first layout determination step of determining whether all elements have been laid out, the second conditioning step of ending the layout when the determined result in the first layout determination step indicates that all the elements have been laid out, and performing extraction of connection information, condition determination of the connection strength, and layout candidate ordering, and storing results in second extracted-element storage means when the determination result in the first layout determination step indicates that all the elements have not been laid out, the second automatic selection step of automatically selecting a layout candidate on the basis of information in the second conditioning step and the information stored in the first extracted-element storage means, the second determination step of determining whether automatic selection has been performed in the second automatic selection step, the second selection step of selecting whether automatic selection or arbitrary selection is performed when a determination result in the second determination step indicates that automatic selection has not been performed, the step of returning the flow to the selection/layout step when arbitrary selection is selected in the second selection step, the layout candidate selection step of selecting whether the information stored in the first extracted-element storage means or the information stored in the second extracted-element storage means is used when automatic selection is selected in the second selection step, the step of returning the flow to the second automatic selection step when a selection result in the layout candidate selection step indicates that the information stored in the first extracted-element storage means is used, the third automatic selection step of automatically selecting a layout candidate on the basis of the information stored in the second extracted-element storage means when the information stored in the second extracted-element storage means is selected to be used in the layout candidate selection step, the third determination step of determining whether automatic selection has been performed in the third automatic selection step, the third selection step of selecting whether automatic selection or arbitrary selection is performed when determination in the third determination step indicates that automatic selection has not been performed, the step of returning the flow to the third automatic selection step when automatic selection is selected to be performed in the third selection step, the step of returning the flow to the selection/layout step when arbitrary selection is selected to be performed in the third selection step, the second layout step of executing layout when automatic selection is determined in the third determination step to have been performed, or when automatic selection is determined in the second determination step to have been performed, the second layout determination step of determining whether all elements have been laid out in the second layout step, the step of returning the flow to the second conditioning step when all the elements are determined in the second layout determination step not to have been laid out, and the step of ending layout when all the elements are determined in the second layout determination step to have been laid out.

According to the fifth aspect of the present invention, in the layout method for the automatic layout apparatus defined in the fourth aspect, the element extraction step comprises the first element extraction step of extracting an element connected to a reference element, the first resistor determination step of determining whether the element extracted in the first element extraction step is a resistor, the first extraction determination step of determining whether all elements have been extracted when the element is determined not to be a resistor in the first resistor determination step, the step of ending element extraction when all the elements are determined in the first extraction determination step to have been extracted, and returning the flow to the first element extraction step when all the elements are determined in the first extraction determination step not to have been extracted, the second element extraction step of, when the element is determined to be a resistor in the first determination step, extracting an element connected to the extracted resistor, the second resistor determination step of determining whether the element extracted in the second element extraction step is a resistor, the second extraction determination step of determining whether all elements have been extracted when the element is determined not to be a resistor in the second resistor determination step, the step of shifting the flow to the first extraction determination step when all the elements are determined in the second extraction determination step to have been extracted, and returning the flow to the second element extraction step when all the elements are determined in the second extraction determination step not to have been extracted, the third element extraction step of, when the element is determined to be a resistor in the second resistor determination step, extracting an element connected to the extracted resistor, the third resistor determination step of determining whether the element extracted in the third element extraction step is a resistor, the third extraction determination step of determining whether all elements have been extracted when the element is determined not to be a resistor in the third resistor determination step, the step of, when all the elements are determined in the third extraction determination step not to have been extracted, shifting the flow to the second extraction determination step, and when the element is determined to be a resistor in the third resistor determination step, extracting elements connected to the resistor until an element connected to the resistor is determined not to be a resistor, the step of determining whether the extracted element is a resistor, and the step of, when the extracted element is not a resistor, determining whether all elements have been extracted, when all the elements are determined to have been extracted, shifting the flow to the extraction determination step one before, and when all the elements are determined not to have been extracted, returning the flow to the element extraction step within the step to repeat the step until no resistor element is extracted, thereby extracting all the elements.

According to the sixth aspect of the present invention, in the layout method for the automatic layout apparatus defined in the fourth aspect, the first conditioning step can comprise the step of determining the connection strength by collating a connection relationship between a reference element and a certain element in the information stored in the first extracted-element storage means with definition condition information stored in the layout condition storage means, and selecting an element having the highest connection strength as a layout candidate element on the basis of a determination result.

According to the seventh aspect of the present invention, in the layout method for the automatic layout apparatus defined in the fourth aspect, the layout candidate ordering is determined by layout condition setting arbitrarily set in the layout condition storage means.

According to the eighth aspect of the present invention, in the layout method for the automatic layout apparatus defined in the seventh aspect, layout conditions set in the layout condition storage means are priorities of connection conditions, and the priorities are set on the basis of connection conditions including transistors having the same size, resistors of the same type with the same size, and a magnitude of a resistance value.

More specifically, the present invention is constituted by a layout candidate selection method of using an arbitrary element having been laid out as a reference element, extracting all elements connected to the reference element, collating the connection relationship between the reference element and the extracted elements with a layout condition file to order layout candidate elements, and automatically selecting the layout candidate elements in accordance with the order.

When the above-mentioned reference element is a transistor, and an element connected to the transistor is a resistor, a transistor connected to this resistor is also extracted, and the connection relationship between the transistors is determined by ignoring the resistor present between the transistors.

The present invention is constituted by a layout candidate element selection method capable of changing the layout candidate element selection order by separately reading a layout candidate selection condition file.

As is apparent from the above aspects, according to the analog LSI layout design method of the present invention, the layout of elements having desired electrical characteristics is facilitated, and the layout design period can be shortened.

This is because an optimal element to be laid out next is automatically selected to eliminate tentative layout of the selected element and selection of another element, and a database for the relative layout definition or group designation need not be prepared for each product.

Second, a constant design efficiency can be easily attained regardless of the skill of the designer because an optimal element is always selected independently of the design skill such as the circuit understanding or the layout ability.

Third, although the present invention is mainly applied to a manual layout design, an optimal layout candidate element can be automatically selected, and the present invention can also be applied to automatic layout because an optimal layout candidate element is always selected, and the automatic layout apparatus performs adjacent layout in the selection order.

The above and many other advantages, features and additional objects of the present invention will become manifest to those versed in the art upon making reference to the following detailed description and accompanying drawings in which preferred embodiments incorporating the principles of the present invention are shown by way of illustrative example.

BRIEF DESCRIPTION OF THE DRAWINGS

FIG. 8 is a table of one condition example for layout condition setting that the user can freely set.

DETAILED DESCRIPTION OF PREFERRED EMBODIMENTS

A preferred embodiment of the present invention will be described in detail below with reference to the accompanying drawings.

Figure 3:
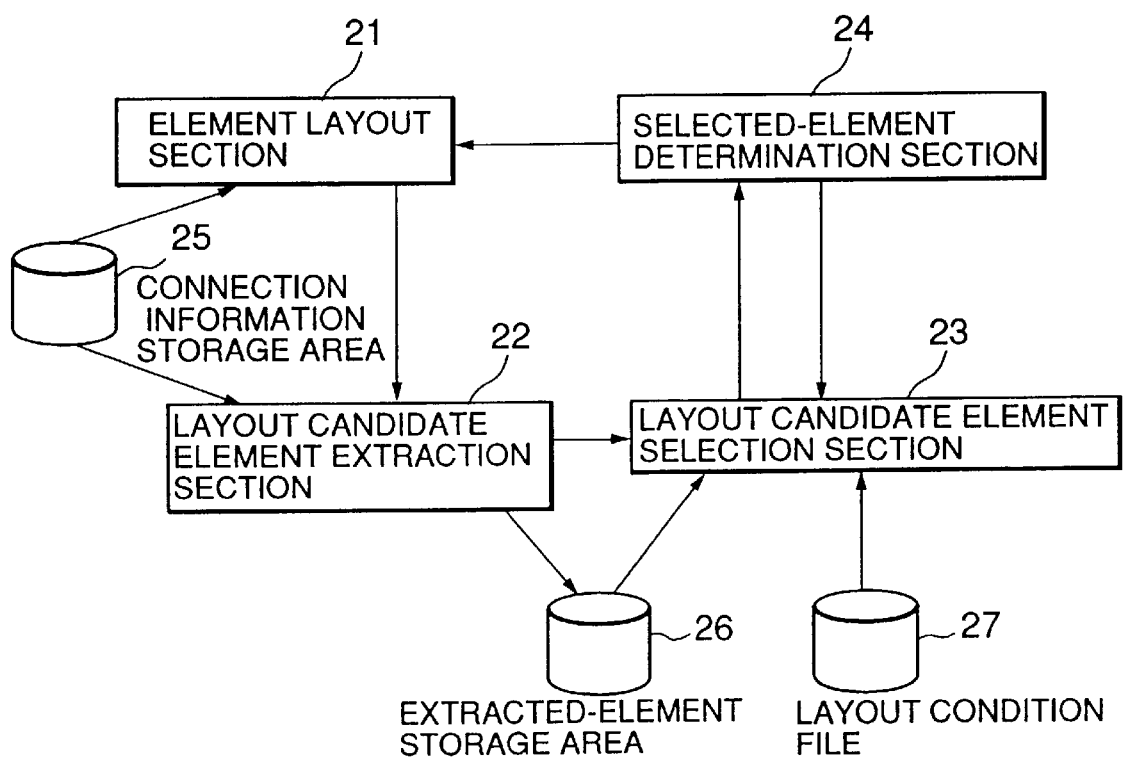
FIG. 3 is a block diagram of the analog LSI layout design apparatus according to the present invention.

Referring to FIG. 3 showing the best form for practicing the present invention, the embodiment of the present invention comprises an element layout section 21, a layout candidate element extraction section 22, a layout candidate element selection section 23, a selected-element determination section 24, a connection information storage area 25, an extracted-element storage area 26, and a layout condition file 27.

Using an element laid out by the element layout section 21 as a reference, the layout candidate element extraction section 22 searches for connection information stored in the connection information storage area 25 to extract all elements which are connected to this element and are not laid out yet. A characteristic operation will be explained with reference to a flow chart in FIG. 4.

Figure 1:
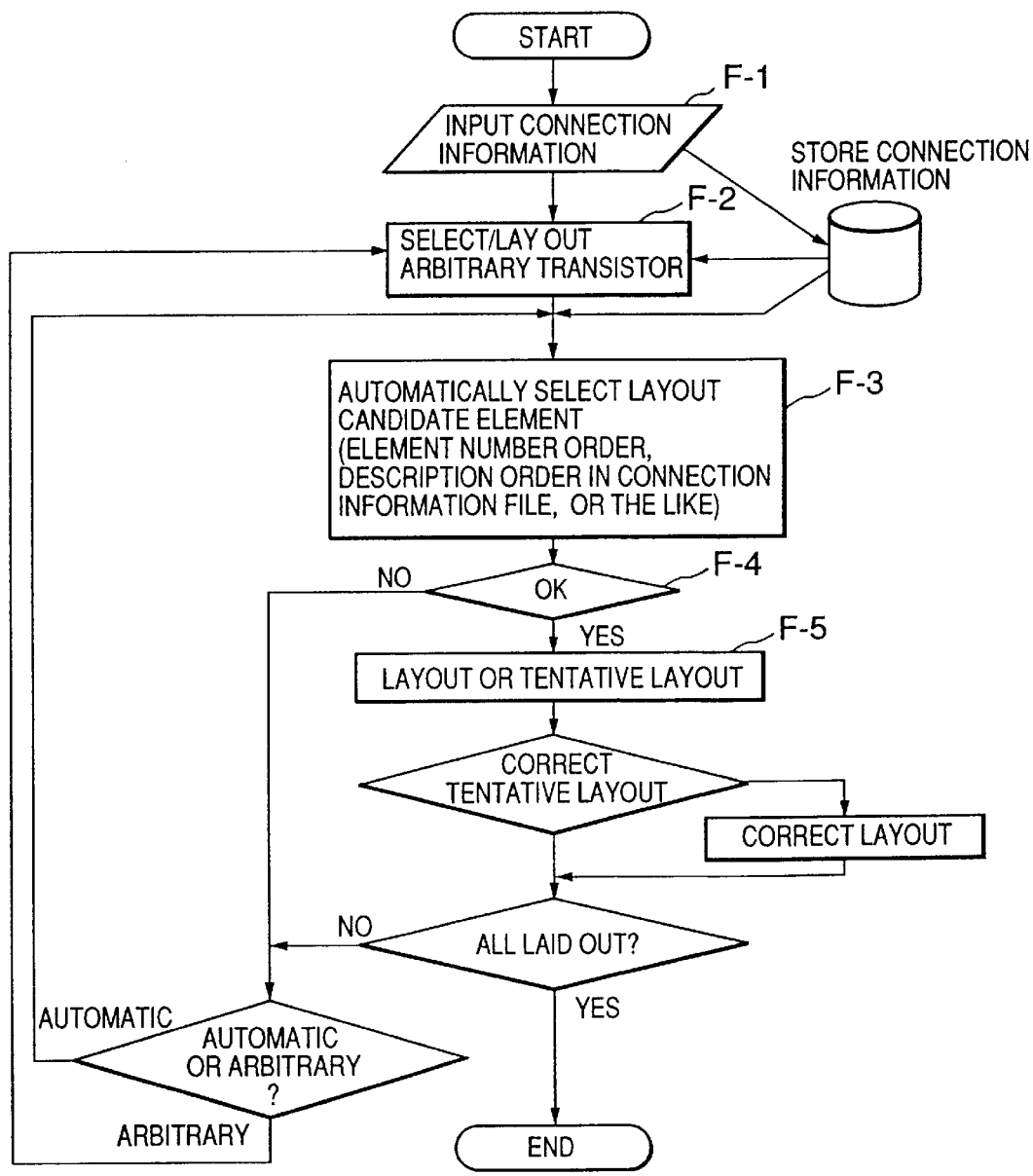
FIG. 1 is a flow chart showing a method of selecting a layout candidate element using a conventional analog LSI layout design apparatus, and a layout execution flow.
Figure 2:
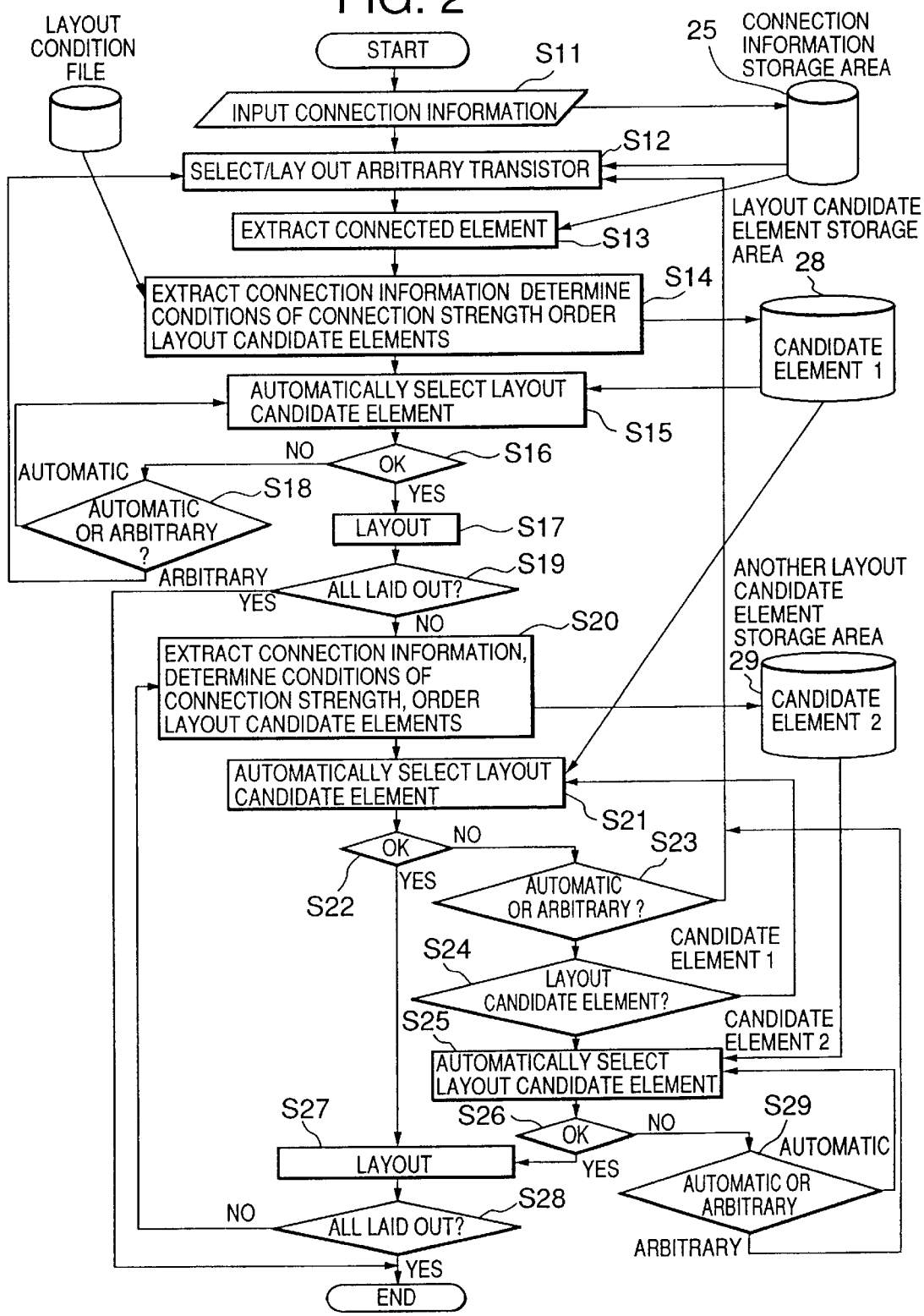
FIG. 2 is a flow chart showing a method of selecting a layout candidate element using an analog LSI layout design apparatus according to the present invention, and a layout execution flow.
Figure 4:
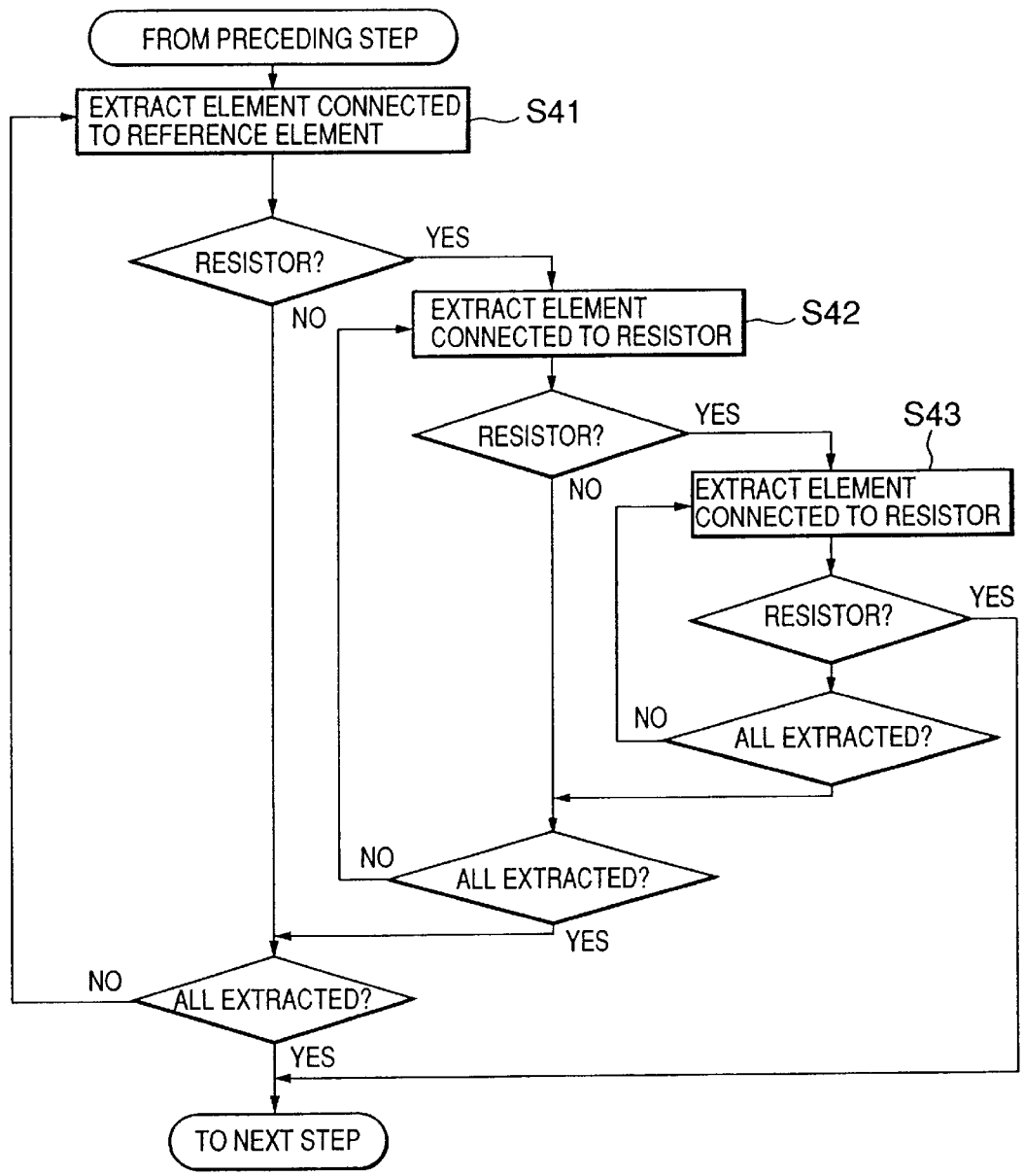
FIG. 4 is a flow chart showing an element extraction flow in the third step according to the present invention.

FIG. 4 is a flow chart for explaining in detail extraction of connection information (step S13) which is extracted from the steps of extraction of connection information (step S13) and condition determination of the connection strength and layout candidate ordering (step S14) in FIG. 2.

In this step, an element which is connected to the reference element and is not laid out yet is extracted from the connection information storage area 25 (step S41). When the reference element is a transistor, the type of extracted element is determined. If the element is a resistor, the reference element for the resistor, and an element connected to the other terminal of the resistor to which the reference element is not connected are extracted from the connection information storage area 25 (steps S41 to S43). The type of extracted element is determined, and if the element is a resistor, the same processing is repeatedly executed. In this manner, when the reference element is a transistor, all elements including one connected to the transistor through a resistor are extracted as layout candidate elements. All the extracted elements are stored in the extracted-element storage area 26.

In automatic selection of a layout candidate element (step S15), the connection relationship between the element stored in the extracted-element storage area 26 and the reference element is collated with conditions defined in the layout condition file 27 to determine the connection strength, and select an element having the highest connection strength as a layout candidate element.

Figure 5:
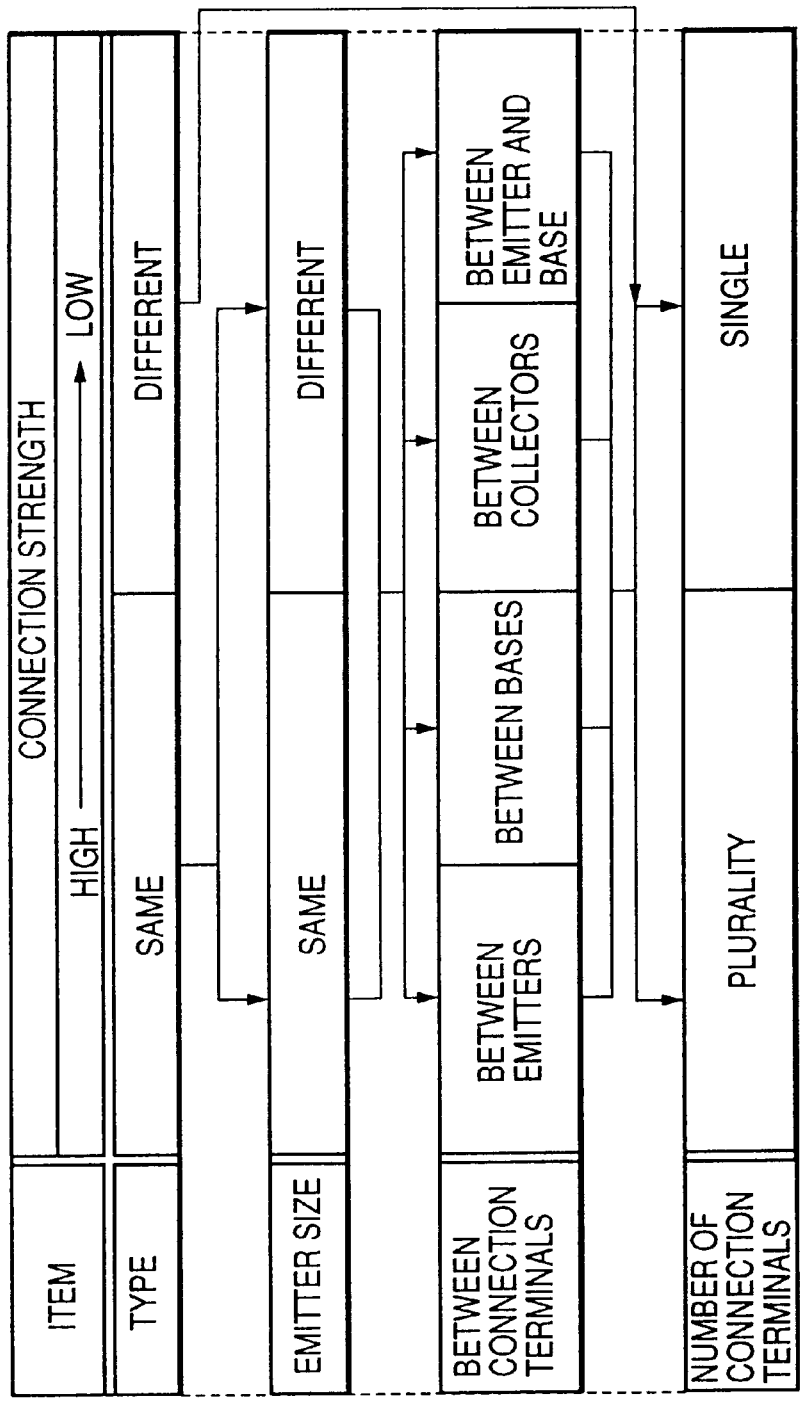
FIG. 5 is a view showing determination conditions for layout candidate element ordering in the fourth step according to the present invention, and the relationship therebetween.

This is related to condition determination of the connection strength and layout candidate element ordering (step S20) rather than processing from extraction of connection information (step S13) and condition determination of the connection strength and layout candidate element ordering (step S14). This operation will be explained with reference to a view in FIG. 5.

Whether connected elements are of the same type is checked. If so, comparison of the emitter size, comparison between connected terminals, and comparison of the number of connected terminals are performed. If not, only the numbers of connected terminals are compared. The connection strength is the highest at the left end, lower toward the right, and the lowest at the right end.

Transistors connected through a resistor are regarded to be directly connected by ignoring the presence of the resistor, and determined. This is because, exemplifying a differential pair connected through a resistor, like the transistors Q1 and Q2 in FIG. 7, the purpose of the resistor is to improve electrical characteristics which cannot be satisfied by only element characteristics, such as a large-signal input or the breakdown voltage, and thus the resistor can be regarded as an emitter resistor. Since such connection is general in an analog circuit, the resistor is ignored, and the connection relationship between the transistors is determined.

A layout method according to the embodiment of the present invention will be described with reference to the accompanying drawings.

FIG. 2 is a flow chart showing the steps in a method of selecting a layout candidate element according to the embodiment of the present invention. The method will be explained with reference to FIG. 2.

In step S11, the connection information of a circuit is input. In step S12, an arbitrary transistor is manually selected and laid out. Using the laid transistor as a reference element, all elements which are connected to the reference element and are not laid out yet are extracted. When a resistor is connected to the reference element, an element connected to the resistor is also extracted. The extracted elements serve as next layout candidate elements (step S13).

Respective connection strengths are calculated from terminals to which the reference element and the extracted elements are connected, and the number of connections. The layout candidate elements are ordered in the order of decreasing the connection strength, and stored in the layout candidate element storage area (step S14). Layout candidate elements are selected from the layout candidate element storage area in the layout candidate element order (step S15).

Whether the selected layout candidate elements are elements intended by the layout designer is checked (step S16). If so, they are manually laid out; otherwise, they are canceled, and next layout candidate elements are obtained. The flow returns to step S15 in automatic selection, or to step S12 in manual selection.

All elements connected to the laid element are extracted, similar to step S13. The layout candidate element order is determined for the extracted elements, similar to step S14, and stored in another layout candidate element storage area (step S20).

Next layout candidate elements are selected from a layout candidate element storage area 28 (step S21). Whether the selected layout candidate elements are intended elements is checked (step S22). If so, they are manually laid out (step S27), and the flow returns to step S20. If not, they are canceled, and any one of the following conditional operations is executed.

① Next layout candidate elements are obtained from the layout candidate element storage area, and the flow returns to step S15.

② The flow returns to step S21 to automatically select next layout candidate elements from the layout candidate element storage area.

③ In manual selection, the flow returns to step S12.

When all the elements are laid out, the layout result is output. The respective steps shown in the flow chart of FIG. 2 has schematically been explained.

Step S13 will be described in detail below.

Step S13 includes the following procedure to extract elements connected to the reference element laid out in step S12.

Figure 6:
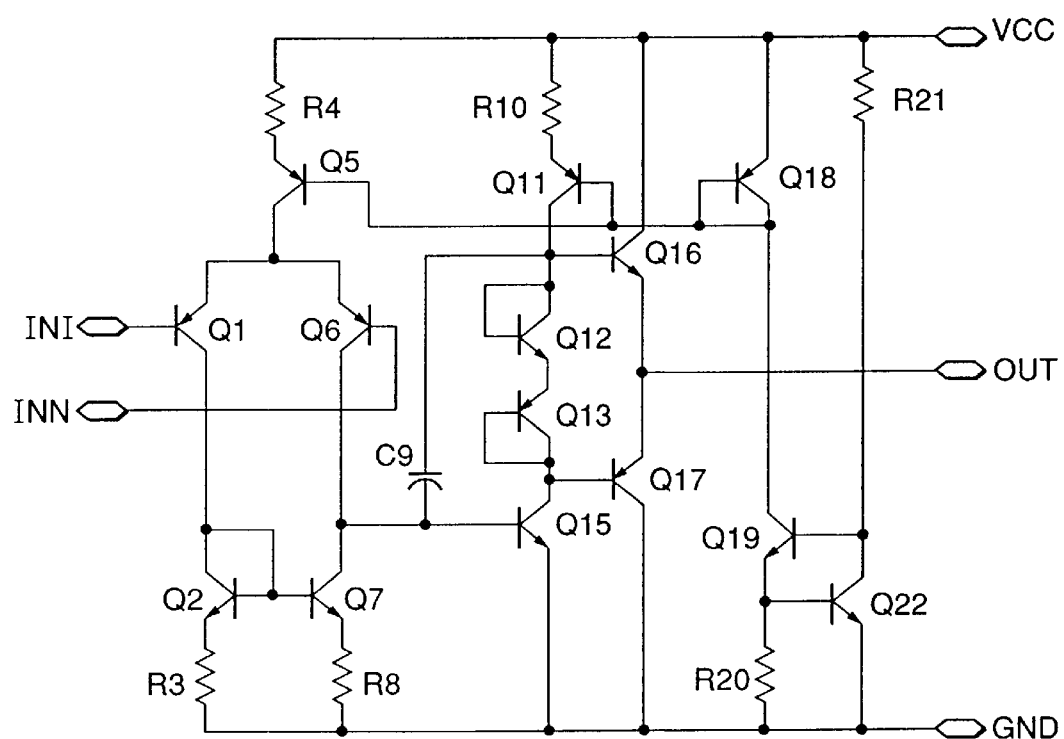
FIG. 6 is a circuit diagram of the first analog circuit applied in the present invention.

When a circuit arrangement shown in FIG. 6 is applied, if the element laid out in step S12 is a transistor Q1, the transistor Q1 is used as a reference element, and all elements (Q2, Q5, Q6, and Q7) connected to the reference element Q1 are extracted.

Figure 7:
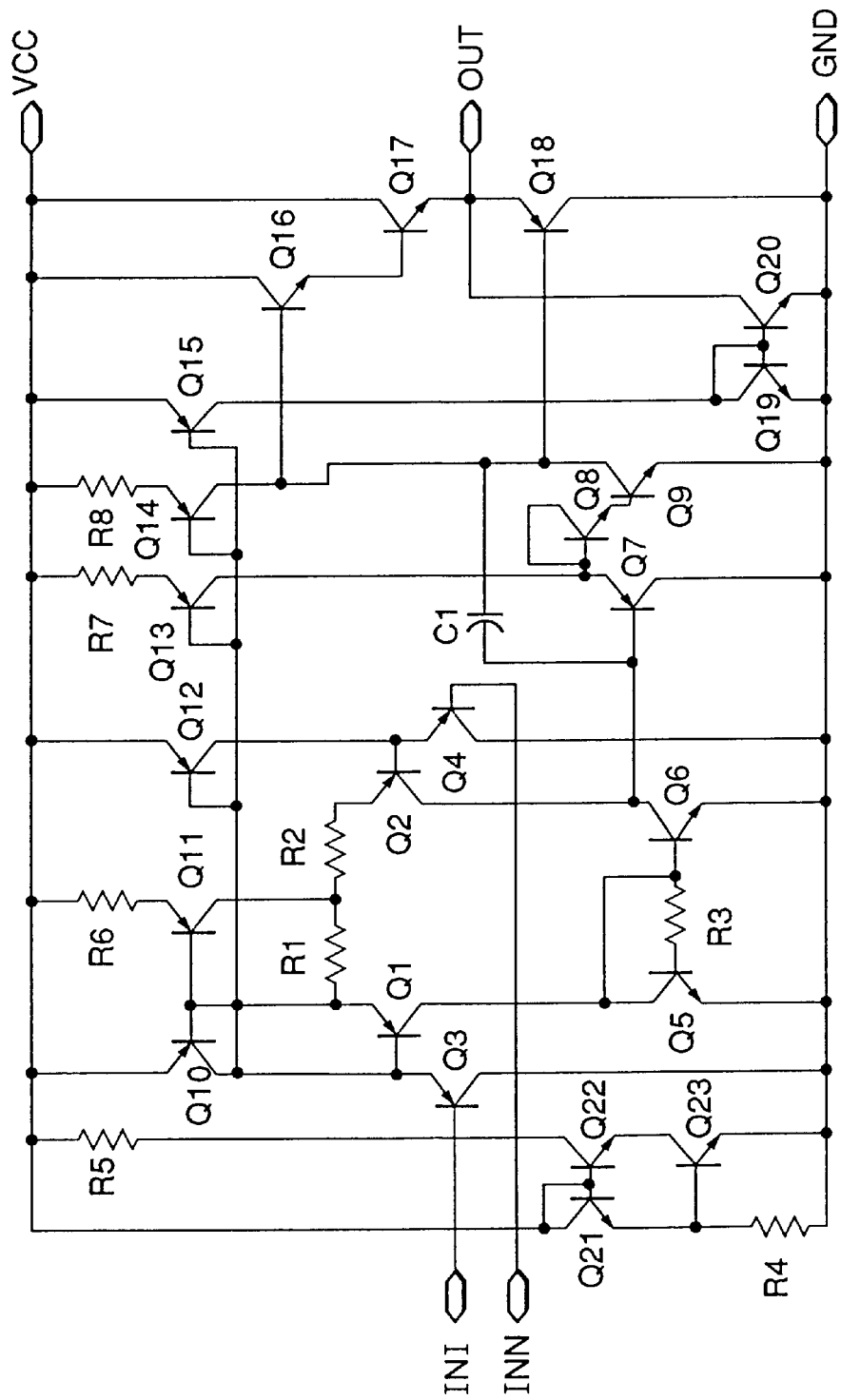
FIG. 7 is a circuit diagram of the second analog circuit applied in the present invention.

In a circuit arrangement shown in FIG. 7, all elements (Q3, Q5, Q6, Q10, Q11, Q12, Q13, Q14, Q15, R1, and R3) connected to the reference element Q1 are extracted. A resistor R2 connected to the extracted register R1 at an opposite terminal to which the reference element is not connected is extracted. The transistor Q2 connected to the opposite terminal of the register R2 is similarly extracted.

As described above, when an element connected to all the elements connected to the reference element is a resistor, an element connected to this resistor is also extracted, and all the extracted elements serve as next layout candidate elements.

Step S14 will be described in detail below. Step S14 includes the following procedure to determine the layout candidate element order of the elements extracted in the above-mentioned step S13.

The layout candidate element order of all the elements extracted in step S13 is determined on the basis of the types of elements and the types of connected terminals. The connection states of all the extracted elements with the transistor serving as the reference element are determined. When a resistor exists between transistors, the resistor is ignored, and the connection state is determined.

More specifically, with reference to FIG. 7, although the transistor Q2 is connected to the reference element Q1 through the resistors R1 and R2, the emitters of the transistors Q2 and Q1 are determined to be directly connected. From the determination results, the layout candidate element order of the extracted transistors is determined in accordance with the order conditions for transistors. When all conditions are the same as a result of determination, the order is determined in the element number order, like the prior art.

The order conditions for transistors are "connection of same type of elements>connection of different types of elements", "same emitter size>different emitter size", "connection between emitters>connection between bases>connection between collectors>connection between emitter and base", and "connection of a plurality of terminals>connection of a single terminal". The order condition for resistors is that a resistor connected to a transistor with a higher layout candidate element order has a higher order. The same is true for capacitors.

With reference to FIG. 6, the layout candidate element order is, from the highest priority, the transistor Q6 which is the same type and connected via the emitters, the transistor Q5 of the same type, the transistor Q2 connected to a plurality of terminals, and the transistor Q7. In short, the layout candidate element order is

Q6>Q5>Q2>Q7

With reference to FIG. 7, the layout candidate element order is the highest for the transistor Q2 because it is regarded to be emitter-connected to the transistor Q1, as described above, and is of the same type. Then, the layout candidate element order is the element number order: the transistor Q10 because of the same type, connection between bases, and connection of a plurality of terminals, and the transistors Q11 to Q16 because of the same type and connection between bases.

Next, the transistor Q3 of the same type is listed up. Since the transistors Q5 and Q6 have different types, the layout candidate element order is the element number order. The layout candidate element order of resistors is the register R1 present between the transistors Q1 and Q2, the register R2, and the register R3.

The layout candidate element order is

Q2>Q10>Q11>Q12>Q13>Q14>Q15>Q3>Q5>Q6>R1>R2>R3

By changing the condition setting, arbitrary layout candidate elements can be automatically selected.

What I claim is:

1. An automatic layout apparatus which lays out elements in an analog LSI layout design, comprising: connection information storage means for storing connection information; extracted-element storage means for storing an extracted element; layout condition storage means for storing layout conditions; element layout means for laying out an element; layout candidate element extration means for extracting a layout candidate element; layout candidate element selection means for selecting said layout candidate element; and selected-element determination means for determining said selected layout candidate element, wherein an element is laid out by said element layout means on the basis of information of said connection information storage means and a result of said selected-element determination means, a layout candidate element is extracted by said layout candidate element extraction means on the basis of a result of said element layout means and information of said connection information storage means, information about said extracted layout candidate element is stored in said extracted-element storage means, said layout candidate element is selected by said layout candidate element selection means on the basis of a result of said layout candidate element extraction means or the information stored in said extracted-element storage means and information stored in said layout condition storage means, a selection result is determined by said selected-element determination means, and when a layout candidate element must be selected again on the basis of a determination result, a layout candidate element is selected by said layout candidate selection means.

2. An apparatus according to claim 1, wherein the information stored in said layout condition storage means is layout condition information in which a circuit feature in a layout design is represented at an element level.

3. An apparatus according to claim 1, wherein said layout candidate element extraction means uses said element laid out by said element layout means as a reference, and searches for the connection information stored in said connection information storage means to extract all elements which are connected to said laid element and are not laid out yet.

4. A layout method for an automatic layout apparatus, comprising:

the connection information storage step of receiving connection information and storing the information in a connection information storage means;

the selection/layout step of selecting/laying out an arbitrary transistor on the basis of the input connection information or information stored in said connection information storage means;

the element extraction step of extracting an element to be connected;

the first conditioning step of performing extraction of the connection information, condition determination of a connection strength, and layout candidate ordering on the basis of information about said element extracted and information stored in layout condition storage means, and storing results in a first extracted-element storage means;

the first automatic selection step of automatically selecting a layout candidate on the basis of information in the first conditioning step or the information stored in said first extracted-element storage means;

the first determination step of determining whether automatic selection has been performed in the first automatic selection step;

the first selection step of selecting whether automatic selection or arbitrary selection is performed when a determination result in the first determination step indicates that automatic selection has not been performed;

the step of returning a flow to the first automatic selection step of automatically selecting said layout candidate when a selection result in the first selection step indicates automatic selection;

the step of returning the flow to the selection/layout step when the selection result in the first selection step indicates arbitrary selection;

the first layout step of executing layout when automatic selection is determined in the first determination step to have been performed;

the first layout determination step of determining whether all elements have been laid out;

the second conditioning step of ending the layout when the determined result in the first layout determination step indicates that all said elements have been laid out, and performing extraction of connection information, condition determination of the connection strength, and layout candidate ordering, and storing results in second extracted-element storage means when the determination result in the first layout determination step indicates that all said elements have not been laid out;

the second automatic selection step of automatically selecting a layout candidate on the basis of information in the second conditioning step and the information stored in said first extracted-element storage means;

the second determination step of determining whether automatic selection has been performed in the second automatic selection step;

the second selection step of selecting whether automatic selection or arbitrary selection is performed when a determination result in the second determination step indicates that automatic selection has not been performed;

the step of returning the flow to the selection/layout step when arbitrary selection is selected in the second selection step;

the layout candidate selection step of selecting whether the information stored in said first extracted-element storage means or the information stored in said second extracted-element storage means is used when automatic selection is selected in the second selection step;

the step of returning the flow to the second automatic selection step when a selection result in the layout candidate selection step indicates that the information stored in said first extracted-element storage means is used;

the third automatic selection step of automatically selecting a layout candidate on the basis of the information stored in said second extracted-element storage means when the information stored in said second extracted-element storage means is selected to be used in the layout candidate selection step;

the third determination step of determining whether automatic selection has been performed in the third automatic selection step;

the third selection step of selecting whether automatic selection or arbitrary selection is performed when determination in the third determination step indicates that automatic selection has not been performed;

the step of returning the flow to the third automatic selection step when automatic selection is selected to be performed in the third selection step;

the step of returning the flow to the selection/layout step when arbitrary selection is selected to be performed in the third selection step;

the second layout step of executing layout when automatic selection is determined in the third determination step to have been performed, or when automatic selection is determined in the second determination step to have been performed;

the second layout determination step of determining whether all elements have been laid out in the second layout step;

the step of returning the flow to the second conditioning step when all said elements are determined in the second layout determination step not to have been laid out;

and the step of ending layout when all said elements are determined in the second layout determination step to have been laid out.

5. A method according to claim 4, wherein the element extraction step comprises:

the first element extraction step of extracting an element connected to a reference element;

the first resistor determination step of determining whether said element extracted in the first element extraction step is a resistor;

the first extraction determination step of determining whether all elements have been extracted when said element is determined not to be a resistor in the first resistor determination step;

the step of ending element extraction when all said elements are determined in the first extraction determination step to have been extracted, and returning the flow to the first element extraction step when all said elements are determined in the first extraction determination step not to have been extracted;

the second element extraction step of, when said element is determined to be a resistor in the first determination step, extracting an element connected to said extracted resistor;

the second resistor determination step of determining whether said element extracted in the second element extraction step is a resistor;

the second extraction determination step of determining whether all elements have been extracted when said element is determined not to be a resistor in the second resistor determination step;

the step of shifting the flow to the first extraction determination step when all said elements are determined in the second extraction determination step to have been extracted, and returning the flow to the second element extraction step when all said elements are determined in the second extraction determination step not to have been extracted;

the third element extraction step of, when said element is determined to be a resistor in the second resistor determination step, extracting an element connected to said extracted resistor;

the third resistor determination step of determining whether said element extracted in the third element extraction step is a resistor;

the third extraction determination step of determining whether all elements have been extracted when said element is determined not to be a resistor in the third resistor determination step;

the step of, when all said elements are determined in the third extraction determination step not to have been extracted, shifting the flow to the second extraction determination step;

and when said element is determined to be a resistor in the third resistor determination step, extracting elements connected to said resistor until an element connected to said resistor is determined not to be a resistor;

the step of determining whether said extracted element is a resistor;

the step of, when said extracted element is not a resistor, determining whether all elements have been extracted;

the step of, when all said elements are determined to have been extracted, shifting the flow to the extraction determination step one before;

and the step of, when all said elements are determined not to have been extracted, returning the flow to the element extraction step within the step and repeating the step until no resistor element is extracted, thereby extracting all said elements.

6. A method according to claim 4, wherein the first conditioning step comprises the step of determining the connection strength by collating a connection relationship between a reference element and a certain element in the information stored in said first extracted-element storage means with definition condition information stored in said layout condition storage means, and selecting an element having the highest connection strength as a layout candidate element on the basis of a determination result.

7. A method according to claim 4, wherein the layout candidate ordering is determined by layout condition setting arbitrarily set in said layout condition storage means.

8. A method according to claim 7, wherein layout conditions set in said layout condition storage means are priorities of connection conditions, and the priorities are set on the basis of connection conditions including each of transistors having the same size, resistors of the same type with the same size, and a magnitude of a resistance value.

* * * * *